US006999369B2

(12) United States Patent
Perner

(10) Patent No.: US 6,999,369 B2
(45) Date of Patent: Feb. 14, 2006

(54) CIRCUIT AND METHOD FOR REFRESHING MEMORY CELLS OF A DYNAMIC MEMORY

(75) Inventor: Martin Perner, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/881,706

(22) Filed: Jun. 30, 2004

(65) Prior Publication Data

US 2005/0030807 A1    Feb. 10, 2005

(30) Foreign Application Priority Data

Jun. 30, 2003    (DE)    ................................ 103 29 370

(51) Int. Cl.
*G11C 7/00*    (2006.01)
(52) U.S. Cl. ........................ 365/222; 365/149; 365/233
(58) Field of Classification Search ................ 365/222, 365/149, 233
See application file for complete search history.

(56) References Cited

U.S. PATENT DOCUMENTS

| | | | |
|---|---|---|---|
| 3,810,129 A | 5/1974 | Behman et al. | |
| 5,890,198 A | 3/1999 | Pawlowski | |
| 6,094,705 A | 7/2000 | Song | |
| 6,388,934 B1 * | 5/2002 | Tobita | ........................ 365/149 |
| 6,483,764 B1 | 11/2002 | Chen et al. | |
| 6,614,704 B1 | 9/2003 | Dobler et al. | |
| 6,646,944 B1 * | 11/2003 | Shimano et al. | ............ 365/222 |
| 2003/0156483 A1 | 8/2003 | Feurle et al. | |

FOREIGN PATENT DOCUMENTS

| | | |
|---|---|---|
| DE | 100 57 275 C1 | 6/2002 |
| DE | 102 06 367 C2 | 12/2003 |
| EP | 0 851 427 A2 | 7/1998 |
| JP | 05101650 A | 4/1993 |
| JP | 09282873 A | 10/1997 |
| WO | WO 98/18130 | 4/1998 |
| WO | WO 00/54159 | 9/2000 |
| WO | WO 02/058072 A2 | 7/2002 |

OTHER PUBLICATIONS

"Infineon Technologies and Micron Technology Announce Cooperation to Develop 'CellularRAM,'" Joint News Release by Infineon and Micron, Munich, Germany/Boise, Idaho, USA, Jun. 24, 2002.
Ohsawa, T., et al., "Optimizing the DRAM Refresh Count for Merged DRAM/Logic LSIs," Proceedings of Intenrational Symposium on Low Power Electronics and Design, 1998, pp. 82-87.

* cited by examiner

*Primary Examiner*—Huan Hoang
(74) *Attorney, Agent, or Firm*—Slater & Matsil, L.L.P.

(57) ABSTRACT

A circuit for refreshing memory cells of a dynamic memory contains a refresh control circuit (3, 4, 7) and a memory circuit (2) for storing a plurality of register bits (2-1 to 2-n), a respective one of the register bits being assigned to at least one of the memory cells. In the event of an access to one of the memory cells, a set circuit (6) sets the assigned register bit (2-1 to 2-n), and a reset circuit (5) resets a set register bit (2-1 to 2-n). For controlling a refresh operation of one of the memory cells (MC), the refresh control circuit (3, 4, 7) evaluates the assigned register bit (2-1 to 2-n) and carries out the refresh operation in a manner dependent on the state of said register bit. For a refresh operation that is to be effected, a plurality of the memory cells (MC) are selected in an ascending or descending order of their addresses (x-Adr), and the respectively assigned register bits (2-1 to 2-n) of the memory cells, for resetting, are selected in an opposite order in a descending or ascending order of their addresses (x-Adr).

19 Claims, 4 Drawing Sheets

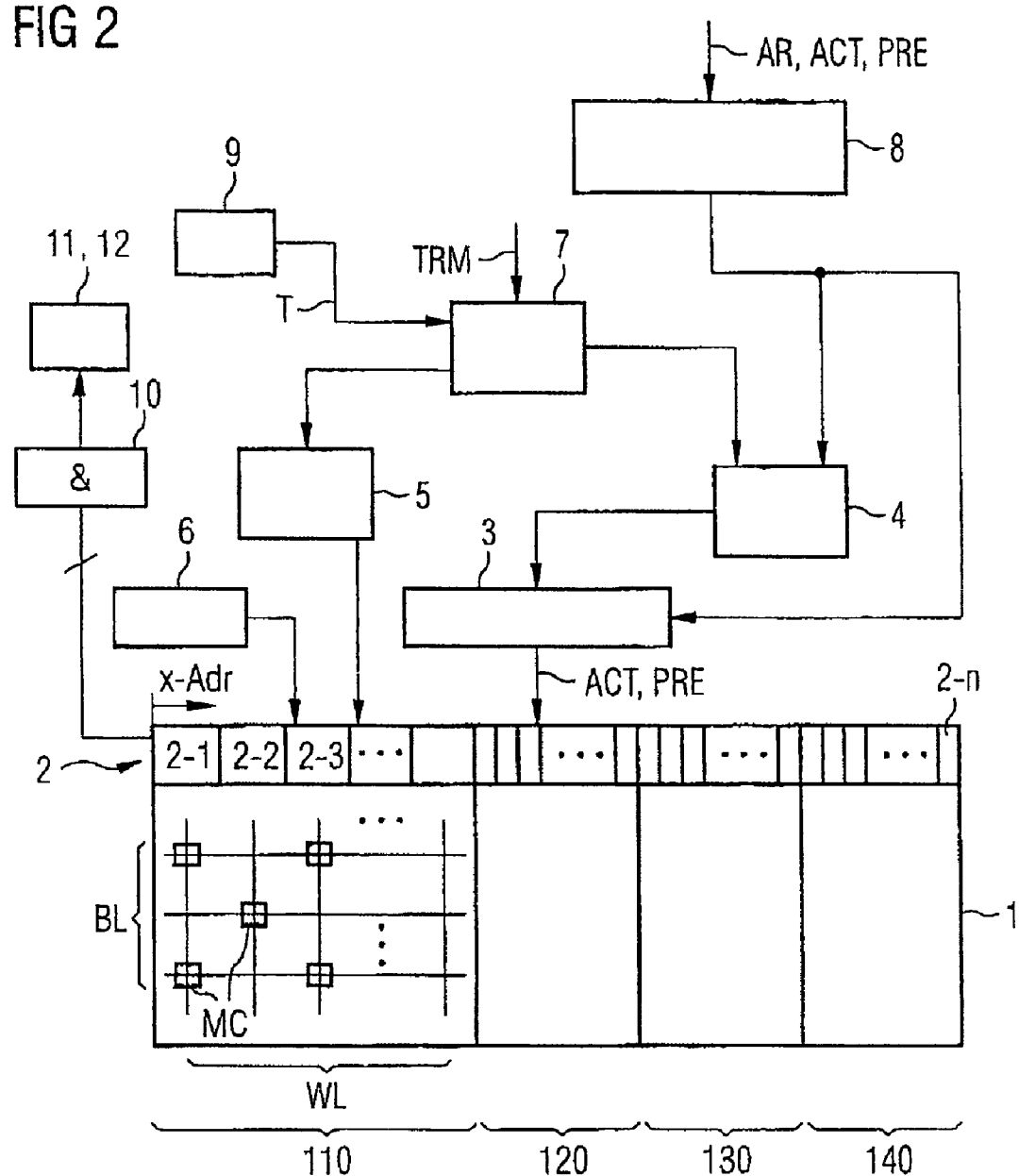

CIRCUIT AND METHOD FOR REFRESHING MEMORY CELLS OF A DYNAMIC MEMORY

TECHNICAL FIELD

The present invention relates to a circuit for refreshing memory cells of a dynamic memory having a refresh control circuit for driving a memory cell array of the dynamic memory for accessing memory cells for a refresh operation. The invention furthermore relates to a method for refreshing memory cells of a dynamic memory.

BACKGROUND

In the case of integrated dynamic memories in the form of DRAMs, in operating times in which memory cells are not accessed externally, a so-called refresh mode is necessary in order to refresh the memory cell content, which may volatilize for example due to leakage currents of the storage capacitor or selection transistor, and thus to permanently retain it. In the refresh mode, the assessed and amplified data signals from selected memory cells are written directly back to the relevant memory cells. This is generally controlled by a refresh control circuit, which additionally defines a refresh frequency with which the memory cell content is respectively refreshed.

For DRAM memory modules, in particular, users are generally demanding ever higher operating temperatures. In this case, however, it must be taken into account that the data retention time of the memory cells decreases as the operating temperature increases, since the leakage currents of the storage capacitor and/or of the respective selection transistor that occur in the memory cells increase as operating temperatures rise. In this case, the refresh frequency can be chosen to be smaller, the greater the maximum achievable data retention time of a memory cell and thus the possible time duration between two refresh cycles for the memory cell. By virtue of the described temperature behavior of the data retention time, generally a common maximum operating temperature, and thus a defined refresh frequency, has hitherto been specified for all DRAM memory modules of one type, so that this avoids excessively great restrictions in the memory access on account of pauses in the memory access that are indicated by the refresh mode.

What is disadvantageous about the previously known types of refresh modes for refreshing memory cells of a dynamic memory is that generally it is not possible to ascertain whether specific memory cells require a refresh of their memory cell content. In this case, it is of importance, in particular, that during active operation of the memory, in which memory cells are selected for example for the readout of data signals, these memory cells are accessed anyway, the data signals read out from selected memory cells being assessed and amplified in a sense amplifier of the memory cell array. As a result, a refresh of the content of the memory cells already takes place during the customary read and write operations of the dynamic memory. In this case, it is unnecessary, for example, to refresh a memory cell that has been addressed shortly beforehand with a read or write operation in a separate refresh mode if the data retention time of this memory cell is still far from having elapsed. In this connection, it is of importance, particularly in the application of dynamic memories in mobile systems, that the current consumption of the memory rises due to frequent refresh operations, in particular caused by the assessment and amplification operation of the respective sense amplifier during the refreshing of the memory cell content.

SUMMARY OF THE INVENTION

The preferred embodiment of the present invention specifies a circuit and a method for refreshing memory cells of a dynamic memory, which make it possible for the required number or frequency of memory refreshes and thus the relevant current consumption of the dynamic memory largely to be reduced.

The circuit according to the preferred embodiment of the invention for refreshing memory cells of a dynamic memory has, in addition to a refresh control circuit, which serves for driving the memory cell array of the dynamic memory for accessing the memory cells thereof for a refresh operation, a memory circuit for storing a plurality of register bits, a respective one of the register bits being assigned to at least one of the memory cells. Furthermore, a set circuit is provided, which sets the assigned register bit in the event of an access to one of the memory cells. Furthermore, a reset circuit is provided, by means of which a set register bit is reset again. In this case the refresh control circuit is designed in such a way that it calls up the state of the register bits and accesses the memory cell array for a refresh operation in such a way that the memory cell assigned to the respective register bit is refreshed in a manner dependent on the state of said register bit. For a refresh operation that is to be effected by means of corresponding selection circuits, a plurality of the memory cells are selected in an ascending or descending order of their addresses and the respectively assigned register bits of the memory cells, for resetting, are selected in an opposite order in a descending or ascending order of their addresses.

According to a method embodiment of the invention, a plurality of register bits are stored. In this case, a respective one of the register bits is assigned to at least one of the memory cells, is set in the event of an access to the assigned memory cell and is reset again at a later point in time. For controlling a refresh operation of one of the memory cells, the assigned register bit is evaluated and the refresh operation is carried out in a manner dependent on the state of the register bit. For a refresh operation that is to be effected, a plurality of the memory cells are selected in an ascending or descending order of their addresses and the respectively assigned register bits of the memory cells, for resetting, are selected in an opposite order in a descending or ascending order of their addresses.

Aspects of the invention make it possible for the number or frequency of memory refreshes largely to be reduced, since, by way of example, the evaluation of the respectively assigned register bit makes it possible either for a memory cell not to be selected at all in the first place for a refresh operation or, in the case of a memory cell originally provided for a refresh operation, for the refresh operation to be suppressed. Aspects of the invention make it possible, in particular, to register each access to one of the memory cells, whereby the memory cell content thereof is also refreshed, as bit information. By way of example, a logic 1 stored with the register bit assigned to a memory cell could denote that the memory cell assigned to the register bit has only recently been refreshed by a memory access and the data retention time of this memory cell has not yet been reached. In this case, it is advantageous if the order of selection of memory cells and of register bits for resetting the same are directed oppositely to one another in order, in particular, to prevent individual register bits from being reset too late or too early relative to the maximum data retention time due to random temporal overlaps.

In a preferred embodiment of the invention, a respective one of the register bits is assigned to one of a plurality of units of memory cells of the dynamic memory, it being possible for in each case a plurality of the memory cells to be selected with the units of memory cells. By way of example, one of the register bits is assigned to one of a plurality of wordlines, so-called rows, of the memory, selection of one of the wordlines being accompanied by selection of the memory cells along said wordline. According to the invention, the memory cells of the unit of memory cells assigned to the respective register bit are refreshed in a manner dependent on the state of said register bit. In this case, by way of example, the number of register bits corresponds to the number of addressable memory rows of all the memory banks of the dynamic memory.

BRIEF DESCRIPTION OF THE DRAWINGS

The invention is explained in detail below with reference to the figures illustrated in the drawings, which illustrate preferred embodiments of the present invention.

FIG. 1, which includes

FIG. 2 shows an exemplary embodiment of a circuit for refreshing memory cells of a DRAM according to the invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
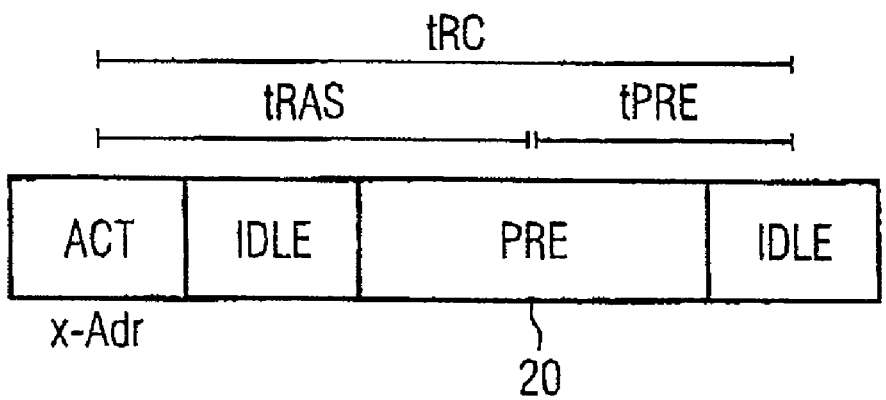
FIGS. 1a–1c, shows, in an overview, schematic illustrations of command sequences for different refresh modes of a DRAM.
Figure 1B:
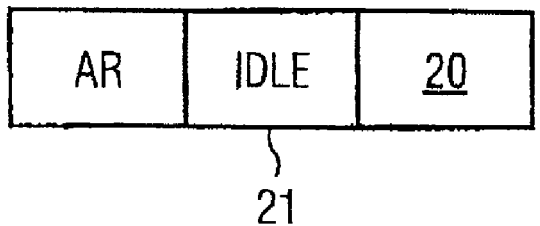
Figure 1C:
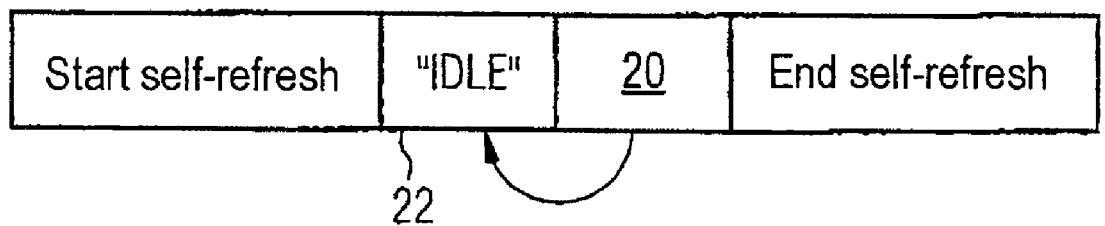

FIGS. 1a–1c (collectively FIG. 1) show, in an overview, a plurality of schematic illustrations of command sequences for different refresh modes of a DRAM. In accordance with FIG. 1a, an activation command ACT with a row address x-Adr is transferred to the memory, whereupon the corresponding memory row (wordline) is activated by an access controller. The activation command ACT is communicated for example by a memory controller connected externally to the memory, either for a targeted refresh operation of the addressed memory row or for an access for reading out or writing data signals of the addressed memory row. In the latter case, in particular, a read or write operation is carried out after the activation command ACT. In the refresh case, by contrast, the memory is in a momentary waiting state before a subsequent precharge command PRE causes the selected memory row to be closed again and precharged. This command sequence, designated by 20 in FIG. 1a, accordingly represents a typical so-called activate-precharge cycle of a dynamic memory. This operation is precluded in the so-called row cycle time tRC composed of the access time tRAS (for example 50 ns) and the precharge time tPRE (for example 20 ns).

FIG. 1b shows a command sequence 21 for a so-called auto-refresh operating mode of the memory. In this case, the memory first of all receives an auto-refresh command AR, which subsequently internally initiates the commands sequence 20 in accordance with FIG. 1a. In this case, by way of example, a so-called internal refresh counter is used to define the row address x-Adr, and thus the row, which is the next one subjected to a refresh. The refresh counter selects for example successively row by row of the memory, in which case, if a plurality of memory banks are provided, such an operation is carried out in parallel in each memory bank by virtue of a memory row in each case being activated and closed again simultaneously in each memory bank. For this purpose, the memory controller that drives the memory sends an auto-refresh command to the memory at time intervals of, for example, 64 ms/4096 (the specified data retention time is 64 ms, for example, and each memory bank has 4096 row addresses).

FIG. 1c shows a command sequence 22 for a self-refresh operating mode, in which, for example, a periodically oscillating refresh oscillator initiates the refresh of the memory cells. This makes it possible for the data of the memory cells to be retained by means of regular refreshing even without an external auto-refresh command. In this case, after the start of the cell-refresh operating mode, the command sequence 20 in accordance with FIG. 1a is again carried out, without a read or write operation being carried out between the activation command ACT and the precharge command PRE. This command sequence is carried out in this case until the self-refresh operating mode is left again. The self-refresh operating mode essentially corresponds to a so-called power-down mode (current saving mode) which is interrupted in accordance with the oscillator frequency by a self-refresh timer in order to carry out a memory-bank-parallel ACT-PRE cycle as a refresh within the row cycle time tRC=tRAS+tPRE.

FIG. 2 shows a preferred embodiment of a circuit for refreshing memory cells of a dynamic memory having a plurality of memory banks according to the invention. The memory cell array 1 of the DRAM is subdivided into a plurality of identical memory banks 110 to 140. The memory cells MC are arranged in the respective memory banks 110 to 140 along wordlines WL (rows) and bitlines BL (columns). The memory cells MC are arranged at crossover points of the wordlines and bitlines and in each case comprise a storage capacitor and a selection transistor in the customary interconnection, which are not illustrated in FIG. 2, however, for reasons of clarity. In order to select one of the memory cells MC, the respective selection transistor is turned on by an activated wordline WL, as a result of which the data signal of the selected memory cells MC along this wordline can subsequently be assessed and amplified by means of a sense amplifier, likewise not illustrated in FIG. 2.

For a refresh operation for refreshing the memory cells, the data signals assessed and amplified by the respective sense amplifiers are written back directly to the relevant memory cells MC. A refresh control circuit, which will be described in more detail hereinafter, is provided for this purpose. In particular, the respectively required activation of sense amplifiers means that a current consumption correlating with the refresh frequency is necessary in the refresh mode of the memory. In the interests of a lowest possible current consumption, it is therefore desirable to dimension the time duration between two refresh cycles to be as large as possible, so that the refresh frequency is as small as possible and the data retention time, which is guaranteed by the manufacturer, is as far as possible always utilized. In this case, the maximum achievable data retention time of the memory cells is crucial for determining the time duration required between two refresh cycles. The latter is influenced in particular by leakage currents in the storage capacitor and/or selection transistor, which increase with increasing memory temperatures.

In accordance with FIG. 2, the command signals AR, ACT and PRE explained in more detail with reference to FIG. 1, which command signals are communicated for example by an external memory controller, are received by a command decoder 8. In the event of direct access to the memory cell array 1, the signals are forwarded directly to the access controller 3, which generates corresponding internal activation commands ACT and precharge commands PRE. For a refresh mode, the refresh control circuit has a first selection circuit 4, which, in interaction with the access controller 3, selects the memory cell MC provided for a refresh operation that is to be effected, or entire units of memory cells MC, for instance in the form of a memory row. In this case, the selection circuit 4 selects for example a plurality of the memory rows in an ascending or descending order of their addresses x-Adr. For this purpose, the refresh control circuit has an oscillator 7, which is connected to the selection circuit 4, for incrementing or decrementing an address x-Adr stored in the selection circuit 4 in a corresponding address register with a defined clock rate.

Furthermore, a memory circuit 2 for storing a plurality of register bits 2-1 to 2-n is provided, a respective one of the register bits 2-1 to 2-n being assigned to one of the wordlines WL. By way of example, the register bit 2-1 is assigned to the first wordline WL of the memory bank 110 (ascending row addresses x-Adr from left to right). The individual register bits 2-1 to 2-n are set by a set circuit 6 in the event of an access to the assigned memory row, for example with a logic 1. A reset circuit with a selection circuit 5 serves for resetting set register bits 2-1 to 2-n. The second selection circuit 5 defines which of the register bits 2-1 to 2-n is reset.

In a first embodiment, the selection circuit 5 is designed in such a way that the respectively assigned register bits 2-1 to 2-n of a plurality of memory rows are successively selected, the respective register bits being reset in the process. For this purpose, the selection circuit 5 is driven by the oscillator 7, which is connected to the selection circuit 5, for incrementing or decrementing an address x-Adr stored in the selection circuit 5 in a corresponding address register with a defined second clock rate, which may be different from the clock rate for driving the selection circuit 4. In another embodiment, the selection circuit 5 is designed in such a way that the assigned register bits of a plurality of memory rows which are set with a "1" are in each case successively selected in a targeted manner, the respective set register bit being reset in the process. In the interaction of the selection circuits 4 and 5, it is advantageous that the selection circuit 4 selects a plurality of the memory rows in an ascending or descending order of their addresses x-Adr, whereas the second selection circuit 5, oppositely to this, selects the respectively assigned register bits 2-1 to 2-n of the memory rows in a descending or ascending order of their addresses x-Adr.

Figure 3:
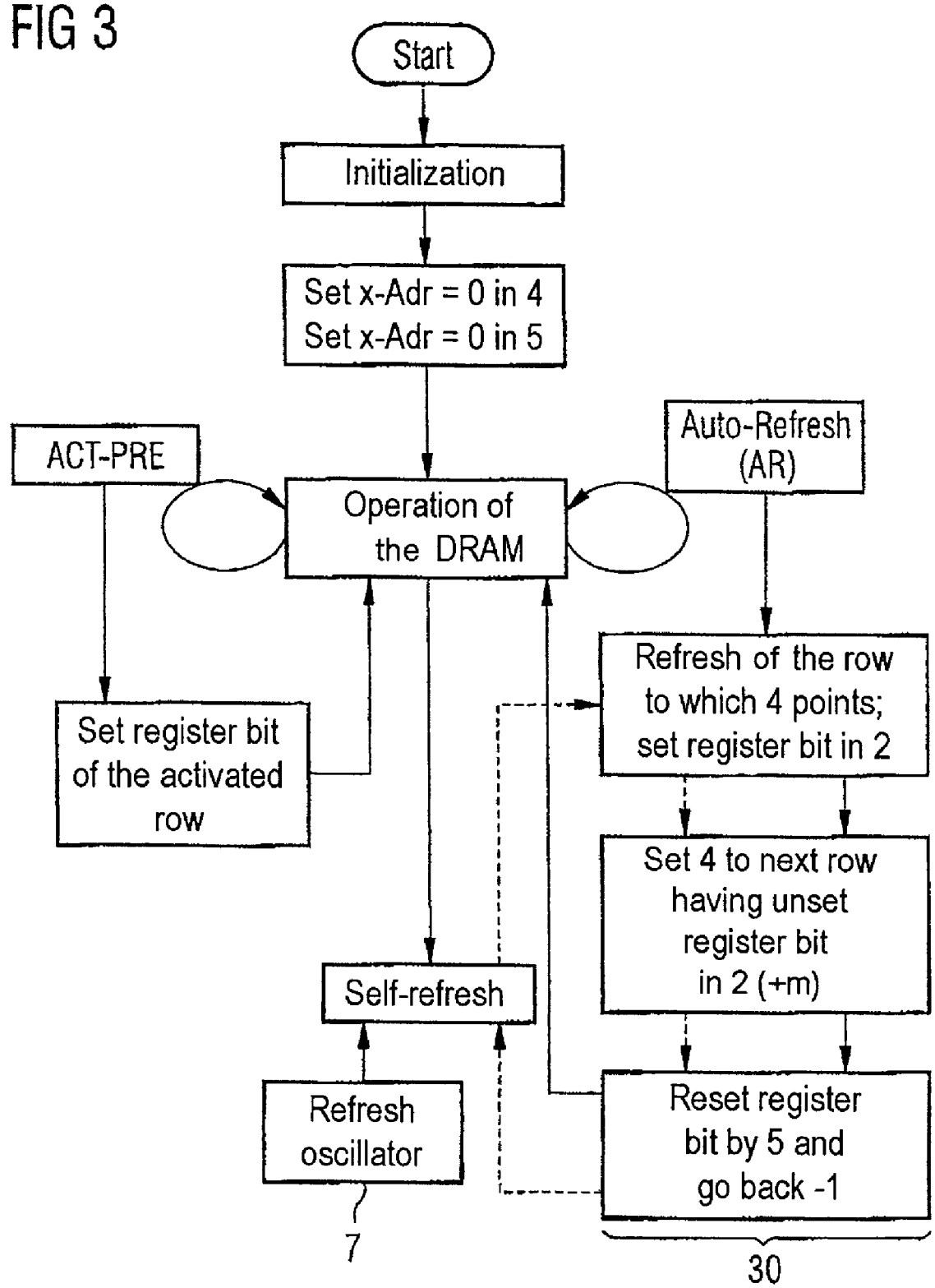
FIG. 3 shows a flowchart of an operating method for refreshing memory cells according to an embodiment of the invention.

FIG. 3 shows a flowchart of an operating method according to the invention for refreshing memory cells of the memory in accordance with FIG. 2. After the initialization of the memory, the respective row addresses x-Adr are set to the value "0" in the address registers of the selection circuits 4 and 5. During operation of the DRAM, for example for read and write operations, the access controller 3 continuously sends activation commands ACT with subsequent precharge commands PRE for access to the memory cell array 1. In the case of such a memory access, the selected memory rows are addressed and activated and the data signals of the corresponding memory cells are assessed and amplified and simultaneously written back to the respective memory cell. Thus, the memory cells are implicitly refreshed during read and write operations as well, so that the assigned register bit 2-1 to 2-n of the activated row is set (left-hand illustration of FIG. 3).

At the same time, for example with a set periodicity, a memory controller sends auto-refresh commands AR to the memory in order to refresh memory rows that have not been accessed in the meantime. In this case, the selection circuit 4, in particular in the form of the refresh counter mentioned above with regard to FIG. 1, selects that memory row which is present for a next refresh operation. Thus, the memory row to which the selection circuit 4 points is selected for a refresh operation and the associated register bit 2-1 to 2-n is set. Afterwards, the address x-Adr is set in the selection circuit 4 to the next memory row, whose register bit is in the unset state, that is to say the address in the selection circuit 4 is for example not increased by the step +1, but rather by a number +m until a memory row with a corresponding unset register bit is reached. Furthermore, the reset circuit with the selection circuit 5 resets the register bit to which the selection circuit 5 points (independently of the previous state of said register bit) and reduces the address in the selection circuit by the step −1.

This sequence of events described with regard to the auto-refresh is designated by 30. It is also carried out for example in a self-refresh mode which is not initiated by an auto-refresh command AR, but rather is carried out automatically for example in the current saving mode of the memory with the aid of the refresh oscillator 7 (sequence shown by broken lines in the flowchart).

Figure 4:
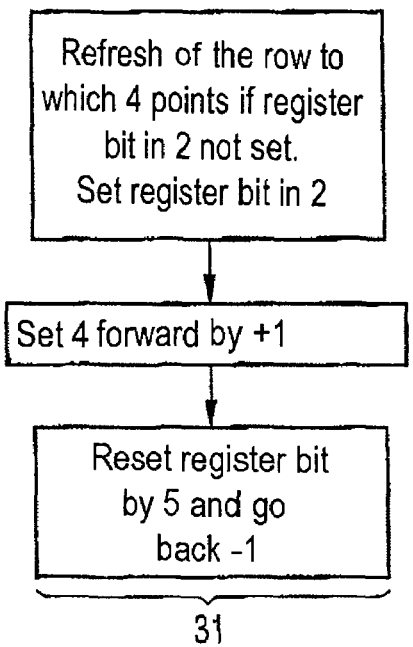
FIGS. 4 and 5 show flowcharts of further operating methods for refreshing memory cells according to an embodiment of the invention.

FIG. 4 shows a flowchart of a sequence of events 31 as an alternative to the sequence of events 30 described in FIG. 3, for illustrating a further operating method for refreshing memory cells according to the invention. In this case, the respectively assigned register bit 2-1 to 2-n of one of the memory rows is evaluated and a refresh operation of this memory row is carried out in a manner dependent on the state of the evaluated register bit. In particular, a refresh of the memory row to which the selection circuit 4 points is carried out only if the associated register bit 2-1 to 2-n in the memory circuit 2 is not set. After the refresh of the memory row, the associated register bit is set and the address x-Adr in the selection circuit 4 is increased by +1. Analogously to the sequence of events 30, a set register bit of the register bits 2-1 to 2-n is reset by the reset circuit with the selection circuit 5 and the row address x-Adr stored therein is reduced by −1.

Figure 5:
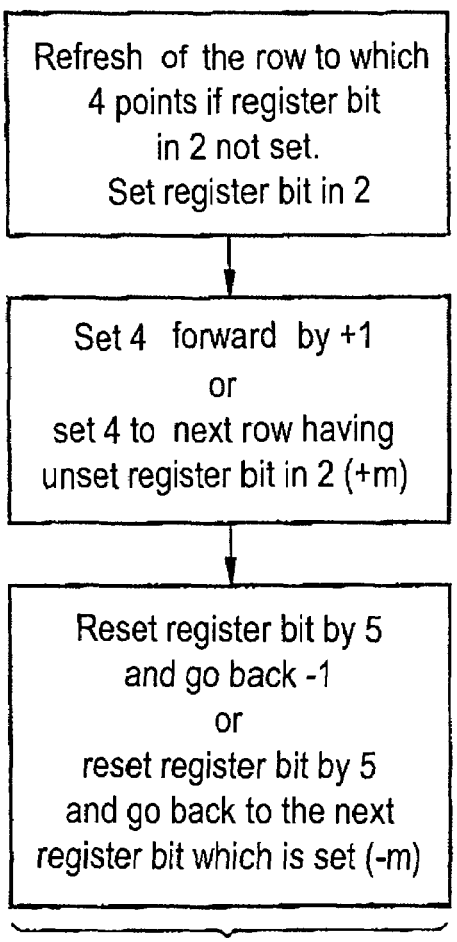

FIG. 5 shows a further flowchart of a sequence of events 32 as an alternative to the sequences of events 30 and 31 described above. Analogously to the sequence of events 31, a memory row to which the selection circuit 4 points is refreshed only if the associated register bit in the memory circuit 2 is not set. The register bit is set with the refresh operation. Afterwards, the address x-Adr in the selection circuit 4 is increased by +1, or, as an alternative thereto, the address x-Adr in the selection circuit 4 is increased to the next memory row having an unset register bit in the memory circuit 2 (increase by the step +m). The reset operation by the reset circuit is carried out analogously to the sequence of events 31. As an alternative thereto, a set register bit in the memory circuit 2 is reset by the reset circuit and the row address x-Adr stored therein is reduced until the next register bit which is set is reached (reduction by the step −m).

As already mentioned above, it is advantageous if the order of selection of memory rows and of register bits for resetting the same are directed oppositely to one another in order, in particular, to prevent (primarily in the case of the same selection rate) individual register bits from being reset too late or too early relative to the maximum data retention time due to random temporal overlaps. Furthermore, a different clock rate of the oscillator 7 with respect to the selection circuit 4 and the selection circuit 5 is advantageous.

By way of example, at a specific memory temperature, the refresh rate of 64 ms/4096 is necessary, so that preferably a higher reset rate of 32 ms/4096 is chosen (this in each case presupposes that one of the memory banks 110 to 140 has 4096 rows in each case and the maximum data retention time is 64 ms). Another advantageous coordination of the reset rate with respect to the refresh rate would be to choose, under standard conditions, a reset rate of 64 ms/4096, but in contrast a refresh rate of 32 ms/4096 by means of auto-refresh command and a self-refresh rate of 64 ms/4096 or 96 ms/496. In this case, then, the higher refresh rate of 32 ms/4096 would refresh more rows than is enabled by the reset rate for the refresh that is to be effected. Active operation of the memory with read and write operations reinforces this state of affairs, so that even fewer dedicated refresh operations as such have to be carried out during operation of the memory.

In accordance with an advantageous embodiment of the invention, in accordance with FIG. 2, the clock rate of the oscillator 7 for driving the selection circuit 4 and/or the clock rate of the oscillator 7 for driving the selection circuit 5 can be set externally by means of a trimming signal TRM. This makes it possible, for example, for a data retention time that is determined in the memory test and, consequently, a refresh rate or a reset rate to be set individually, for instance with the aid of a self-test unit (BIST) or in the so-called front-end test mode by means of external test systems.

In order to be able to take account of the influence of the memory temperature on the data retention time of the memory cells, the circuit according to the invention advantageously has a temperature sensor circuit 9 in order to detect the temperature of the DRAM. In this case, the clock rate of the oscillator 7 is set by the control signal T of the temperature sensor circuit 9 in a manner dependent on the temperature of the memory. As a result, both the clock rate for driving the selection circuit 4 and the clock rate for driving the selection circuit 5 can be set in temperature-dependent fashion.

In accordance with a further advantageous embodiment of the invention, a supervisory unit 10 is provided, to which all the register bits 2-1 to 2-n are fed and which combines the latter with one another in an AND combination. The supervisory unit 10 has an output which, for external read-out of the combination result, can be connected to a circuit terminal 11 that can be contact-connected externally or to a register circuit 12 that can be read externally. Thus, in the present exemplary embodiment, all 4*4096 register bit information items are logically ANDed in the supervisory unit 10, it being possible for the combination result to be interrogated externally for example by a memory controller. The state "1" would mean that all memory rows have been accessed within the refresh rate and no auto-refresh command is inherently necessary for refreshing memory cells. The state "0" means that at least one of the memory rows is to be refreshed, with the result that an auto-refresh command is sent by the memory controller.

In a further embodiment of the present invention, the memory circuit advantageously comprises dynamic memory cells such as so-called trench cells or stacked cells, in which the register bits 2-1 to 2-n are stored. In this case, a positive charge is stored in the dynamic memory cells for setting the respective register bit. The memory circuit 2 is thus compatible with the DRAM memory cell concept, the memory cells likewise having a limited data retention time. A physically stored "1" in the form of a positive charge is usually less stable than a physically stored "0", in particular caused by the electrical driving and the resultant paths of leakage currents. In the worst case, a stored "1" changes into a stored "0", with the result that, in this case, the individual memory rows are subjected to a refresh operation too early, rather, and a necessary refresh operation is in no way omitted.

The invention as described above, in particular the exemplary circuit according to FIG. 2, may be integrated as a circuit on a semiconductor memory (e.g., on the same semiconductor substrate as the memory array 1) or as a circuit on a memory controller (e.g., on the same semiconductor substrate as the controller circuitry that provides commands such as ACT, PRE and AR). Also possible, in principle, are any desired distributed circuits both on the semiconductor memory and on the memory controller, which interact in the manner described above for controlling refresh operations. By means of circuit configurations that are to be selected in a suitable manner, it is possible, as described above, to choose whether the memory controller issues auto-refresh commands in a regular order and said commands are suppressed after evaluation of the respective register bits, or whether the memory controller directly evaluates the register bits and accordingly only generates auto-refresh commands which are required for a targeted refresh operation. If the refresh control circuit is situated on the memory controller, it is possible to generate, instead of an auto-refresh command, a targeted command sequence comprising an activation command ACT and precharge command PRE for the memory in order to select, in a targeted manner, the next memory row to be refreshed.

Although the present invention and its advantages have been described in detail, it should be understood that various changes, substitutions and alterations can be made herein without departing from the spirit and scope of the invention as defined by the appended claims.

What is claimed is:

1. A circuit for refreshing memory cells of a dynamic memory, the circuit comprising:
   a memory cell array including a plurality of dynamic random access memory cells;
   a refresh control circuit coupled to the memory cell array so as to drive the memory cell array and access ones of the memory cells for a refresh operation, the refresh control circuit including a first selection circuit that selects at least one of the memory cells for a refresh operation that is to be effected;
   a memory circuit for storing a plurality of register bits, a respective one of the register bits being assigned to at least one of the memory cells;
   a set circuit coupled to the memory circuit so as to set the assigned register bit in the event of an access to one of the memory cells; and
   a reset circuit coupled to the memory circuit so as to reset a set register bit, the reset circuit including a second selection circuit that defines which of the register bits is reset.

2. The circuit of claim 1 wherein
the refresh control circuit calls up the state of the register bits and accesses the memory cell array in such a way that the memory cell assigned to the respective register bit is refreshed in a manner dependent on the state of said register bit;
the first selection circuit selects a plurality of the memory cells in an ascending or descending order of their addresses; and
the second selection circuit selects the respectively assigned register bits of the memory cells in an opposite order in a descending or ascending order of their addresses.

3. The circuit as claimed in claim 2, wherein
a respective one of the register bits is assigned to one of a plurality of groups of memory cells of the dynamic memory, wherein each memory cell in the group of memory cells can be selected; and
the refresh control circuit accesses the memory cell array in such a way that the memory cells of the group of memory cells assigned to the respective register bit are refreshed in a manner dependent on the state of the register bit.

4. The circuit as claimed in claim 2 wherein the first selection circuit selects, for a refresh operation that is to be effected, one of the memory cells whose assigned register bit is not set.

5. The circuit as claimed in claim 2 wherein the refresh control circuit evaluates the respectively assigned register bit and carries out a refresh operation of one of the memory cells in a manner dependent on the state of the evaluated register bit.

6. The circuit as claimed in claim 2 wherein the second selection circuit successively selects the respectively assigned register bits of a plurality of memory cells and resets the respective register bit in the process.

7. The circuit as claimed in claim 2 wherein the second selection circuit successively selects in a targeted manner the respectively assigned register bits of a plurality of memory cells which are set, and resets the respective register bit in the process.

8. The circuit as claimed in claim 2 wherein the refresh control circuit includes an oscillator that is coupled to the second selection circuit, for incrementing or decrementing an address stored in the second selection circuit with a defined first clock rate.

9. The circuit as claimed in claim 8 wherein the first clock rate of the oscillator can be set externally by means of a trimming signal.

10. The circuit as claimed in claim 2 wherein the refresh control circuit includes an oscillator that is coupled to the first selection circuit, for incrementing or decrementing an address stored in the first selection circuit with a defined second clock rate.

11. The circuit as claimed in claim 10 wherein the second clock rate of the oscillator can be set externally by means of a trimming signal.

12. The circuit as claimed in claim 10 and further comprising a temperature sensor circuit for detecting a temperature of the dynamic memory, the clock rate of the oscillator can be set by a control signal of the temperature sensor circuit in a manner dependent on the temperature of the dynamic memory.

13. The circuit as claimed in claim 1 and further comprising a supervisory unit coupled to receive each of the register bits, the supervisory unit outputting an AND combination of the register bits.

14. The circuit as claimed in claim 12 wherein the supervisory unit includes an output which, for the external read-out of the combination result, can be coupled to a circuit terminal that can be contact-connected externally.

15. The circuit as claimed in claim 12 wherein the supervisory unit includes an output which, for the external read-out of the combination result, can be coupled to a register circuit that can be read externally.

16. The circuit as claimed in claim 1 wherein the memory circuit comprises dynamic memory cells in which the register bits are stored, a positive charge being stored in the dynamic memory cells for the setting of the respective register bit.

17. A method for refreshing memory cells of a dynamic memory, the method comprising:
storing a plurality of register bits, a respective one of the register bits being assigned to at least one of the memory cells of the dynamic memory, which register bit is set in the event of an access to the assigned memory cell and is reset at a later point in time;
determining a memory cell that is to be refreshed;
evaluating the assigned register bit for the determined memory cell; and
performing a refresh operation on the determined memory cell if a state of the register bit indicates that a refresh operation is to be carried out, wherein the refresh operation is not performed if the state of the register bit indicates that a refresh operation is not to be carried out.

18. The method of claim 17 wherein performing a refresh operation comprises selecting a plurality of the memory cells in an ascending or descending order of their addresses.

19. The method of claim 18 and further comprising selecting the respectively assigned register bits of the memory cells for resetting, the selecting being performed in an order opposite of the order that the plurality of memory cells were selected.

* * * * *